United States Patent [19]
Rahim et al.

[11] Patent Number: 5,900,763
[45] Date of Patent: May 4, 1999

[54] CIRCUIT AND METHOD OF REDUCING CROSS-TALK IN AN INTEGRATED CIRCUIT SUBSTRATE

[75] Inventors: Irfan Rahim, Selanger, Malaysia; Bor-Yuan Hwang, Tempe; Kuntal Joardar, Chandler, both of Ariz.

[73] Assignee: Motorola, Inc., Schaumburg, Ill.

[21] Appl. No.: 08/317,673

[22] Filed: Oct. 11, 1994

[51] Int. Cl.⁶ ..................................................... H01L 21/26
[52] U.S. Cl. .......................... 327/292; 327/310; 327/311; 327/551; 327/565; 327/379; 257/544; 257/565
[58] Field of Search ..................................... 327/551, 564, 327/565, 567, 379, 381, 292, 311, 310; 257/369, 409, 544, 204, 206

[56] References Cited

U.S. PATENT DOCUMENTS 4,597,805  7/1986  Mohan Rao ............................. 257/544
5,027,183  6/1991  Dreps ..................................... 252/544

*Primary Examiner*—Timothy P. Callahan
*Assistant Examiner*—Dinh Le
*Attorney, Agent, or Firm*—Robert D. Atkins

[57] ABSTRACT

An integrated circuit (10) provides analog and digital circuitry on a common substrate (12). A first digital circuit (14) operates in combination with an analog circuit (18) to perform a useful function. A second duplicate digital circuit (26) is disposed adjacent to the first digital circuit and operates out-of-phase with respect to the first digital circuit. The second duplicate digital circuit introduces voltage spikes equal and opposite to the voltage spikes introduced into the substrate by the first digital circuit. The equal and opposite voltage spikes tend to cancel and thereby minimize cross-talk between the digital and analog circuits. A guard ring (16,28) surrounds each of the first and second digital circuits and the analog circuit to reduce voltage spikes into the substrates. By minimizing cross-talk, the analog circuit operates without interference from the digital circuits.

20 Claims, 1 Drawing Sheet

CIRCUIT AND METHOD OF REDUCING CROSS-TALK IN AN INTEGRATED CIRCUIT SUBSTRATE

BACKGROUND OF THE INVENTION

The present invention relates in general to integrated circuit design and, more particularly, to reducing cross-talk between circuits disposed on a common integrated circuit substrate.

Electronic circuits commonly use digital and analog functions in the same design. In the past, the analog functions were typically placed on one integrated circuit (IC) die while the digital functions were placed on a second IC die. With ICs becoming highly compact and miniaturized, say in the 0.5 micron range, many functions may be integrated onto a single IC die. In order to save space and reduce overall costs a common trend is to integrate the digital and analog functions onto the same IC substrate.

One significant problem associated with the digital and analog integration to a common IC die is the associated cross-talk between the digital and analog circuitry. The digital circuitry operating at say 100.0 megahertz with sharp edges of say one nanosecond rise and fall times creates significant dv/dt induced voltage spikes in the substrate of the IC. These voltage spikes travel through the conductive substrate and interfere with the analog circuitry located in other areas of the IC substrate. The voltage spikes can cause variation in the power supply and ground busses as well as interfering with input signals to the analog circuitry. Basically the voltage spikes induced by digital switching interferes with the fundamental operation of the analog circuitry.

One known solution to help minimize the digital cross-talk is to place guard rings around the digital circuit and the analog circuit. For example in a p-type substrate a heavily doped p+ region surrounds the digital circuit and is connected to ground potential. The heavily doped region tends to absorb the cross-talk emanating from the digital circuit. Guard rings are effective only up to a certain frequency of operation of the digital circuit. To increase the effectiveness of the guard rings it is necessary to widen the p+ region. It is impractical in many applications to dedicate large areas of the IC die to guard ring protection.

Hence, a need exists to reduce cross-talk between digital and analog circuits that are disposed on a common IC substrate.

DETAILED DESCRIPTION OF THE PREFERRED EMBODIMENT

Figure 1:
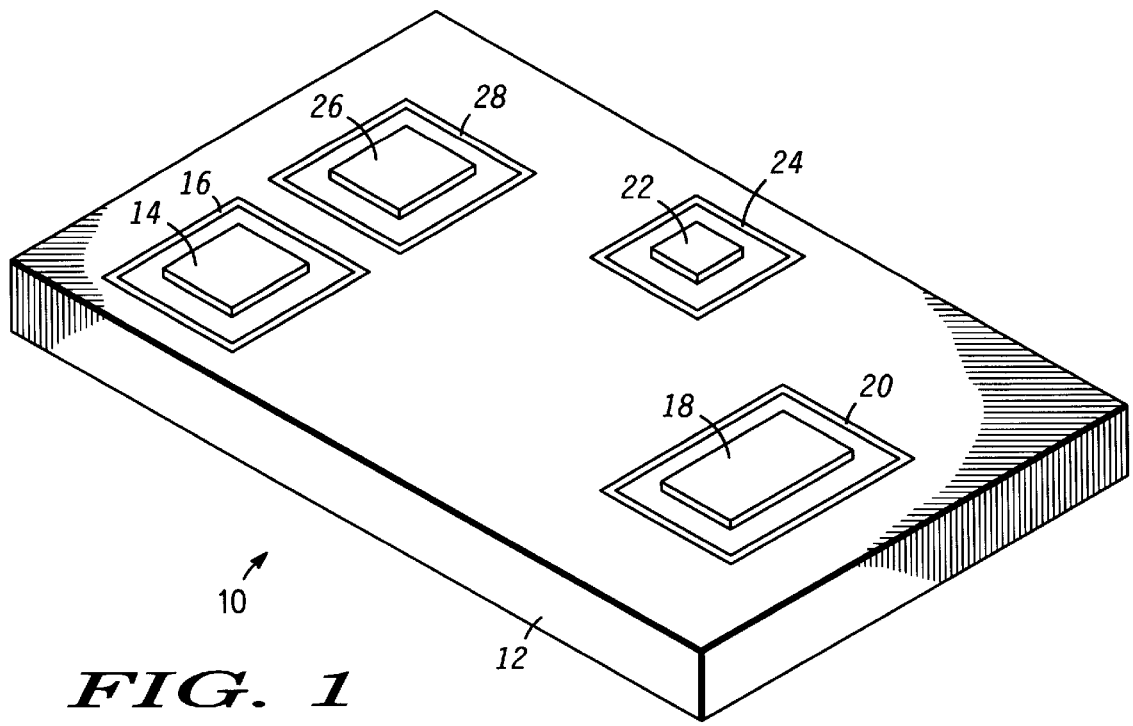
FIG. 1 illustrates digital and analog circuits on a common IC die.

Referring to FIG. 1, an IC 10 is shown suitable for manufacturing using conventional integrated circuit processes such as 0.5 micron technology. IC 10 includes a substrate 12 made of p-type material such as boron doped silicon. The IC includes digital and analog circuitry that operate together to perform the overall circuit operation. A digital circuit 14 is disposed on substrate 12. Digital circuit 14 may provide for example a digital synthesizer function and operate at 100.0 megahertz with one nanosecond rise and fall times. A guard ring 16 made of heavily doped p+ type material, e.g. boron doped silicon, surrounds digital circuit 14 with a width of 10–20 microns. Guard ring 16 reduces voltage spikes into substrate 12.

Integrated circuit 10 further includes analog circuit 18 disposed on substrate 12. Analog circuit 18 may operate for example as an amplifier. Other analog circuits (not shown) may be disposed on substrate 12 to perform more complex functions. Analog circuit 18 is surrounded by guard ring 20 to aid in isolation of cross-talk from the digital circuitry on substrate 12. Guard ring 20 is made of p+ type material, e.g. boron doped silicon, with a width of 10–20 microns. When operating by itself, digital circuit 14 is noisy and emits significant voltage spikes, see waveform 14 in FIG. 2, into substrate 12 due to the rapid switching of voltage signals (large dv/dt). Digital circuit 14 thus may contribute substantial voltage spikes into substrate 12 resulting in interference with operation of analog circuit 18.

As part of the present invention, digital circuit 26 is disposed on substrate 12 adjacent to digital circuit 14. Digital circuit 26 is a duplicate of digital circuit 14 although operating in opposite phase to produce equal and opposite voltage spikes as the voltage spikes introduced by functional digital circuit 14. Digital circuit 26 is further surrounded by guard ring 28 made of a heavily doped p+ type material, e.g. boron doped silicon, with a width of 10–20 microns. Guard ring 28 reduces voltage spikes into substrate 12. When operating by itself, digital circuit 26 emits voltage spikes, see waveform 26 in FIG. 2, into substrate 12 due to the rapid switching of voltage signals (large dv/dt). Digital circuit 26 is configured to operate in anti-phase so that it produces voltage spikes that are out-of-phase with respect to voltage spikes generated by digital circuit 14.

In one embodiment, digital circuit 14 is configured to provide a function such as a digital synthesizer. Digital circuit 26 is configured structurally identical to digital circuit 14 while operating 180 degrees out-of-phase. For example, digital circuit 26 may receive input signals that are inverted with respect to the input signals to digital circuit 14. For other more complex digital functions, it may be necessary to observe the voltage spikes from digital circuit 14 operating by itself and then make adjustments to digital circuit 26 while operating by itself as necessary to achieve equal and opposite voltage spikes. The voltage spikes from digital circuit 26 have the same amplitude and zero offset as the voltage spikes from-digital circuit 14 as seen at times $t_1$ and $t_2$. Waveform 14 and waveform 26 are each the mirror image of the other, i.e. 180 degrees out-of-phase. Thus, when both digital circuits 14 and 26 operate together the waveforms substantially cancel each other resulting in a quiet substrate with minimal cross-talk from digital circuit 14 to analog circuit 18.

In an alternate embodiment, digital circuit 26 may be configured structurally differently than digital circuit 14 provided it produces voltage spikes that are substantially equal and opposite as the voltage spikes from digital circuit 14 and therefore provide effective cancellation to minimize cross-talk.

Analog circuits may also generate noise into the substrate of an IC. Hence, digital circuits 14 and 26 may be replaced with analog circuits where one analog circuit produces the needed function while the other analog circuit operates in anti-phase to cancel voltage spikes induced by the first functional analog circuit into the substrate. Likewise, circuit 18 may be a digital circuit.

Figure 2:
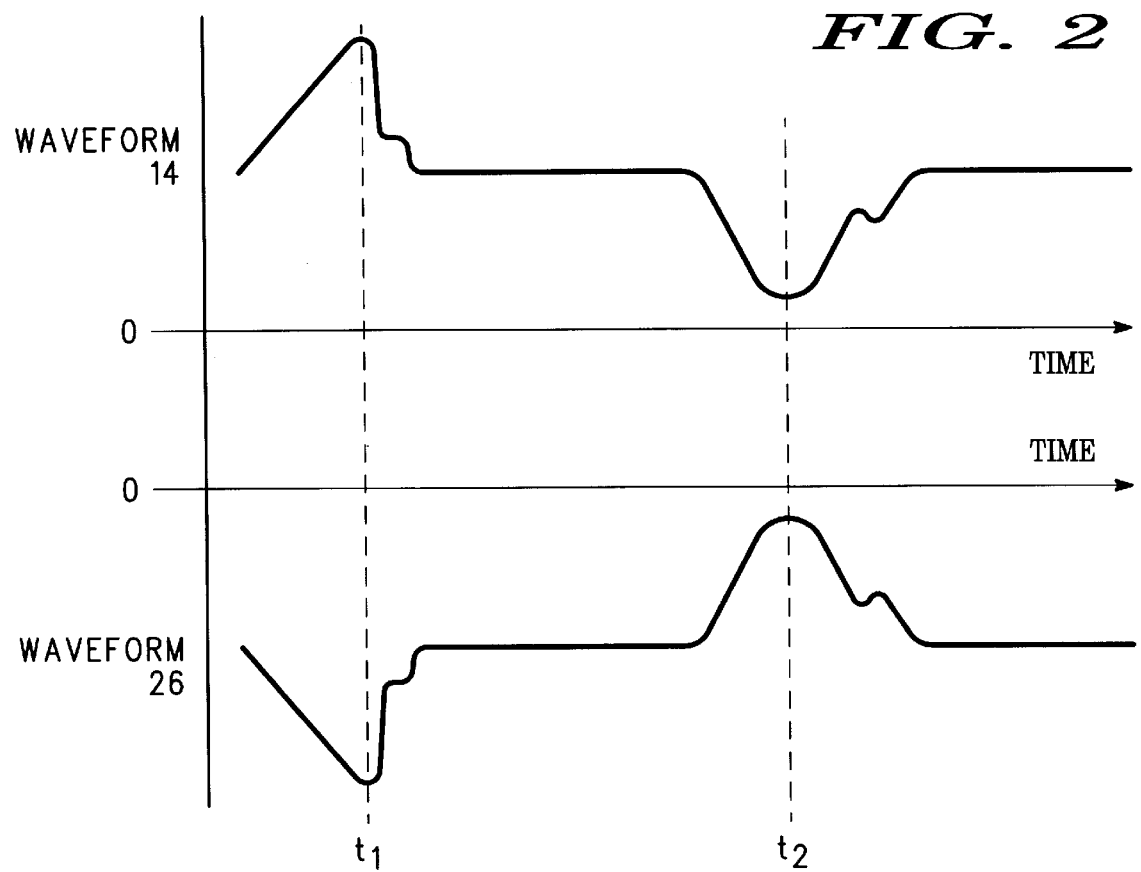
FIG. 2 illustrates waveform plots useful in the explanation of the invention.

Digital circuits 14 and 26 are placed as close together as the process permits to aid in the interference of the waveforms shown in FIG. 2 and achieve the desired cancellation.

Furthermore, circuit 18 should be placed as far from the digital circuits as practical as any remaining cross-talk tends to decay as it travels through substrate 12. To further aid in reducing cross-talk guard rings 16 and 28 are connected to a digital ground terminal while guard ring 20 is connected to a separate analog ground terminal.

IC 10 further includes other digital circuitry such as digital circuit 22 surrounded by guard ring 24. Digital circuit 22 may operate for example as combinational logic. The noise introduced into substrate 12 from digital circuit 22 is substantially canceled by guard ring 24 and thus does not impair the operation of circuit 18. Thus, while the present invention is applicable to noisy circuitry such as digital circuit 14, it is not necessary to duplicate each and every digital circuit on the IC die.

By now it should be appreciated that the present invention provide minimal cross-talk between digital and analog circuitry on a common IC substrate. One digital circuit is configured to perform a desired function while a second identical digital circuit is configured to operate out-of-phase and produce voltage spikes that cancel voltage spikes generated by the functional digital circuit. By reducing cross-talk, the analog circuit operates without interference from the digital circuits.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, substrate 12 may be n-type material with appropriate doping for the guard rings.

What is claimed is:

1. An integrated circuit, comprising:
    a first circuit disposed on a substrate for providing a predetermined function; and
    a second circuit disposed on said substrate and operating out-of-phase with respect to said first circuit to cancel voltage spikes into said substrate introduced by said first circuit.

2. The integrated circuit of claim 1 further including an analog circuit disposed on said substrate.

3. The integrated circuit of claim 2 wherein said first and second circuits are structurally identical while operating 180 degrees out-of-phase and therefore produce voltage spikes into said substrate that are 180 degrees out-of-phase.

4. The integrated circuit of claim 2 wherein said first and second circuits are structurally different while producing voltage spikes into said substrate that are 180 degrees out-of-phase.

5. The integrated circuit of claim 2 wherein said substrate is made of a first type of semiconductor material.

6. The integrated circuit of claim 5 further including a first guard ring disposed around said first circuit and coupled to a first ground terminal.

7. The integrated circuit of claim 6 wherein said first guard ring is made of a doped first type of semiconductor material.

8. The integrated circuit of claim 7 further including a second guard ring disposed around said second circuit and coupled to said first ground terminal.

9. The integrated circuit of claim 8 wherein said second guard ring is made of said doped first type of semiconductor material.

10. The integrated circuit of claim 9 further including a third guard ring disposed around said analog circuit and coupled to a second ground terminal.

11. The integrated circuit of claim 10 wherein said third guard ring is made of said doped first type of semiconductor material.

12. A method of canceling cross-talk in an integrated circuit, comprising:
    disposing an analog circuit on a substrate;
    disposing a first digital circuit on said substrate; and
    disposing a second digital circuit on said substrate where said second digital circuit operates out-of-phase with respect to said first digital circuit to cancel voltage spikes into said substrate introduced by said first digital circuit and further to minimize interference with operation of said analog circuit.

13. The method of claim 12 wherein said first and second digital circuits are structurally identical while operating 180 degrees out-of-phase and therefore produce voltage spikes into said substrate that are 180 degrees out-of-phase.

14. The method of claim 12 wherein said first and second digital circuits are structurally different while producing voltage spikes into said substrate that are 180 degrees out-of-phase.

15. The method of claim 12 wherein said substrate is made of a first type of semiconductor material.

16. The method of claim 15 further including:
    a first guard ring made of a doped first type of semiconductor material disposed around said first digital circuit and coupled to a first ground terminal;
    a second guard ring made of said doped first type of semiconductor material disposed around said second digital circuit and coupled to said first ground terminal; and
    a third guard ring made of said doped first type of semiconductor material disposed around said analog circuit and coupled to a second ground terminal.

17. An integrated circuit, comprising:
    a first circuit disposed on a substrate;
    a second circuit disposed on said substrate and operating with said first circuit for providing a predetermined function; and
    a third circuit disposed on said substrate and operating out-of-phase with respect to said second circuit to cancel voltage spikes into said substrate produced by said second circuit and further to minimize interference with operation of said first circuit.

18. The integrated circuit of claim 17 wherein said second and third circuits are structurally identical while operating 180 degrees out-of-phase.

19. The integrated circuit of claim 17 wherein said second and third circuits are structurally different while producing voltage spikes into said substrate that are 180 degrees out-of-phase.

20. The integrated circuit of claim 17 further including:
    a first guard ring disposed around said second circuit and coupled to a first ground terminal;
    a second guard ring disposed around said third circuit and coupled to said first ground terminal; and
    a third guard ring disposed around said first circuit and coupled to a second ground terminal.

* * * * *